US011114785B2

(12) United States Patent
Hung

(10) Patent No.: US 11,114,785 B2
(45) Date of Patent: Sep. 7, 2021

(54) CONNECTOR

(71) Applicant: Dongguan Luxshare Technologies Co., Ltd, Dongguan (CN)

(72) Inventor: Yung-Chih Hung, Taipei (TW)

(73) Assignee: DONGGUAN LUXSHARE TECHNOLOGIES CO., LTD, Dongguan (CN)

( * ) Notice: Subject to any disclaimer, the term of this patent is extended or adjusted under 35 U.S.C. 154(b) by 0 days.

(21) Appl. No.: 16/942,006

(22) Filed: Jul. 29, 2020

(65) Prior Publication Data

US 2021/0226367 A1    Jul. 22, 2021

(30) Foreign Application Priority Data

Jan. 21, 2020   (TW) .................................. 109102322

(51) Int. Cl.
| | | |
|---|---|---|
| *H01R 24/00* | (2011.01) | |
| *H01R 12/71* | (2011.01) | |
| *H01R 13/405* | (2006.01) | |
| *H05K 1/11* | (2006.01) | |
| *H01R 13/502* | (2006.01) | |
| *H01R 12/55* | (2011.01) | |

(52) U.S. Cl.
CPC .......... *H01R 12/716* (2013.01); *H01R 12/55* (2013.01); *H01R 13/405* (2013.01); *H01R 13/502* (2013.01); *H05K 1/111* (2013.01)

(58) Field of Classification Search
CPC .. H01R 12/716; H01R 13/405; H01R 13/502; H01R 12/55; H05K 1/111

USPC ........................................................... 439/72
See application file for complete search history.

(56) References Cited

U.S. PATENT DOCUMENTS

| | | | | |
|---|---|---|---|---|
| 6,343,957 | B1* | 2/2002 | Kuo ....................... | H01R 31/06 439/362 |
| 7,267,579 | B1* | 9/2007 | Wu ..................... | H01R 13/6658 439/607.41 |
| 7,341,487 | B2* | 3/2008 | Wu ..................... | H01R 13/6658 439/497 |
| 7,351,106 | B2* | 4/2008 | Zhu ...................... | H01R 12/716 439/377 |

(Continued)

FOREIGN PATENT DOCUMENTS

| | | |
|---|---|---|
| CN | 104377481 A | 2/2015 |
| CN | 206471630 U | 9/2017 |

(Continued)

*Primary Examiner* — Abdullah A Riyami
*Assistant Examiner* — Nelson R. Burgos-Guntin
(74) *Attorney, Agent, or Firm* — Birch, Stewart, Kolasch & Birch, LLP

(57) ABSTRACT

The present disclosure provides a connector, comprising a connector body, a plurality of signal terminals, a plurality of wiring terminals, and a circuit board. The connector body comprises an electrical connection slot, a circuit board slot, and a wiring slot. The plurality of signal terminals and the plurality of wiring terminals are disposed on the sidewall of the electrical connection slot. The plurality of signal terminals is corresponded to the plurality of wiring terminals, respectively. The circuit board comprises a circuit board body and a plurality of conductive pads. The circuit board is inserted into the circuit board slot. The plurality of conductive pads is in contact with the corresponding signal terminal.

16 Claims, 15 Drawing Sheets

(56) References Cited

U.S. PATENT DOCUMENTS

| | | | |
|---|---|---|---|
| 7,371,118 B2* | 5/2008 | Wu | H01R 24/62 439/607.45 |
| 7,393,249 B2* | 7/2008 | Wagner | H01R 13/506 439/620.24 |
| 7,497,738 B2* | 3/2009 | Kuo | H01R 29/00 439/638 |
| 7,628,638 B2* | 12/2009 | Wu | H01R 13/6275 439/358 |
| 8,337,241 B2* | 12/2012 | Foung | H01R 4/2416 439/536 |
| 10,476,208 B1* | 11/2019 | Shen | H01R 12/716 |
| 10,826,243 B2* | 11/2020 | Shen | H05K 1/025 |
| 2007/0270042 A1* | 11/2007 | Belopolsky | H01R 13/6625 439/668 |
| 2009/0209120 A1* | 8/2009 | Tanaka | H01R 12/712 439/78 |
| 2010/0103626 A1* | 4/2010 | Lai | H01R 13/7031 361/728 |
| 2010/0248536 A1* | 9/2010 | Ushiro | H01R 13/743 439/557 |
| 2010/0267281 A1* | 10/2010 | Li | H01R 13/6582 439/607.01 |
| 2014/0295693 A1* | 10/2014 | Zhang | H01R 13/64 439/374 |
| 2015/0349554 A1* | 12/2015 | Christensen | H02J 7/0042 320/134 |
| 2016/0156114 A1* | 6/2016 | Kao | H01R 12/724 439/83 |
| 2016/0156145 A1* | 6/2016 | Kao | H01R 13/4361 439/676 |
| 2016/0365673 A1* | 12/2016 | Liang | H01R 13/6469 |
| 2017/0110837 A1* | 4/2017 | Taniguchi | H01R 13/6683 |
| 2017/0170596 A1* | 6/2017 | Goossens | H01R 13/5202 |
| 2017/0179658 A1* | 6/2017 | Chuang | H01R 12/724 |
| 2017/0207685 A1* | 7/2017 | Ushio | H05K 5/064 |
| 2018/0233848 A1* | 8/2018 | Lin | H01R 13/405 |
| 2018/0366852 A1* | 12/2018 | Yang | H01R 12/721 |
| 2019/0058298 A1* | 2/2019 | Tsai | H01R 24/60 |
| 2019/0190213 A1* | 6/2019 | Wu | H01R 13/502 |
| 2020/0076133 A1* | 3/2020 | Shen | H01R 13/6471 |
| 2020/0112129 A1* | 4/2020 | Liu | H01R 13/6585 |
| 2020/0244025 A1* | 7/2020 | Winey | H01R 43/26 |
| 2020/0259278 A1* | 8/2020 | Hung | H01R 12/58 |
| 2020/0280142 A1* | 9/2020 | Hung | H01R 9/24 |
| 2020/0335889 A1* | 10/2020 | Hung | H01R 13/40 |
| 2021/0006000 A1* | 1/2021 | Wallensteiner | H01R 13/6597 |
| 2021/0091523 A1* | 3/2021 | Chang | H01R 13/629 |
| 2021/0126397 A1* | 4/2021 | Hung | H01R 13/506 |

FOREIGN PATENT DOCUMENTS

| | | |
|---|---|---|
| CN | 208272202 U | 12/2018 |
| TW | 395588 U | 6/2000 |
| TW | 449127 U | 8/2001 |
| TW | M309789 U | 4/2007 |
| TW | M539714 U | 4/2017 |
| TW | M559016 U | 4/2018 |
| TW | M593076 U | 4/2020 |

* cited by examiner

CONNECTOR

CROSS REFERENCE TO RELATED APPLICATION

This application claims the priority benefit of Taiwanese Patent Application Serial Number TW109102322, filed on Jan. 21, 2020, the full disclosure of which is incorporated herein by reference.

BACKGROUND

Technical Field

The present disclosure relates to the technical field of connector, particularly to a connector with replaceable circuit board.

Related Art

Conventional connectors are provided with fixed circuit board being electrically connected to the terminals in the connector. However, the circuit board of the conventional connectors is not replaceable, having the connectors ultimately single-functional. Thus, users are not able to insert a circuit board that meets their needs but to alternatively choose other connectors.

SUMMARY

The embodiments of the present disclosure provide a connector to solve the problem of the inconvenient, single-functional connectors in which the circuit board could not be replaced.

The present disclosure provides a connector, comprising a connector body, a plurality of signal terminals, a plurality of wiring terminals, and a circuit board. The connector body comprises an electrical connection slot, a circuit board slot, and a wiring slot. The electrical connection slot is disposed at one end of the connector body. The circuit board slot and the wiring slot are disposed at the other end of the connector body. The electrical connection slot respectively communicates with the circuit board slot and the wiring slot. The plurality of signal terminals is disposed on the sidewall of the electrical connection slot. One end of each of the plurality of signal terminals away from the electrical connection slot is disposed in the circuit board slot. The plurality of wiring terminals is disposed on the sidewall of the electrical connection slot. The plurality of wiring terminals corresponds to the plurality of signal terminals, respectively. One end of each of the plurality of wiring terminals away from the electrical connection slot extends toward the wiring slot. The circuit board comprises a circuit board body and a plurality of conductive pads disposed on the circuit board body. The circuit board is inserted into the circuit board slot; the plurality of conductive pads is respectively in contact with the corresponding signal terminals.

In the embodiments of the present disclosure, the connector could have different functions by inserting circuit boards that meet the requirements into the connector body, thereby enhancing the convenience of use.

It should be understood, however, that this summary may not contain all aspects and embodiments of the present disclosure, that this summary is not meant to be limiting or restrictive in any manner, and that the disclosure as disclosed herein will be understood by one of ordinary skill in the art to encompass obvious improvements and modifications thereto.

BRIEF DESCRIPTION OF THE DRAWINGS

The features of the exemplary embodiments believed to be novel and the elements and/or the steps characteristic of the exemplary embodiments are set forth with particularity in the appended claims. The Figures are for illustration purposes only and are not drawn to scale. The exemplary embodiments, both as to organization and method of operation, may best be understood by reference to the detailed description which follows taken in conjunction with the accompanying drawings in which:

DETAILED DESCRIPTION OF THE EMBODIMENTS

Figure 1:
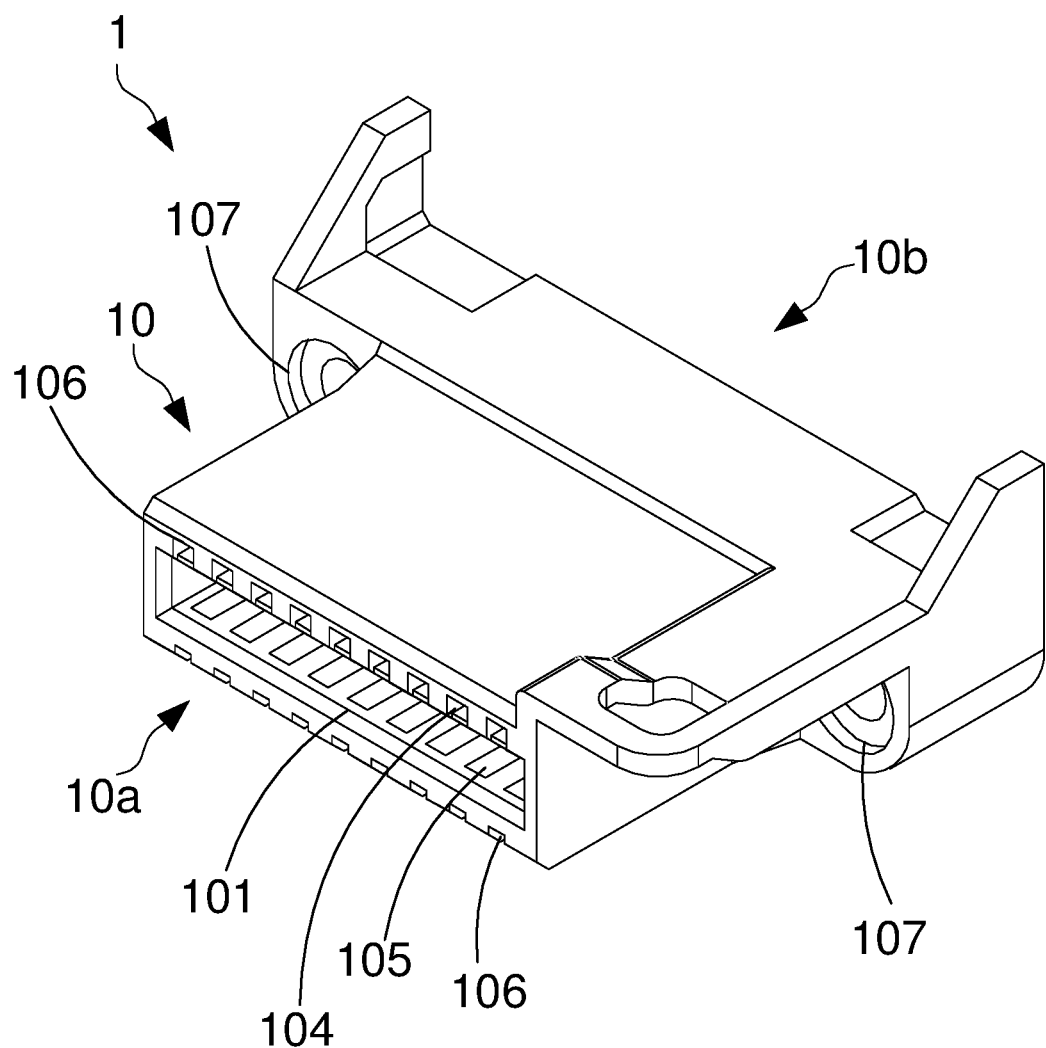
FIG. 1 is a perspective view of a connector of the first embodiment of the present disclosure.
Figure 2:
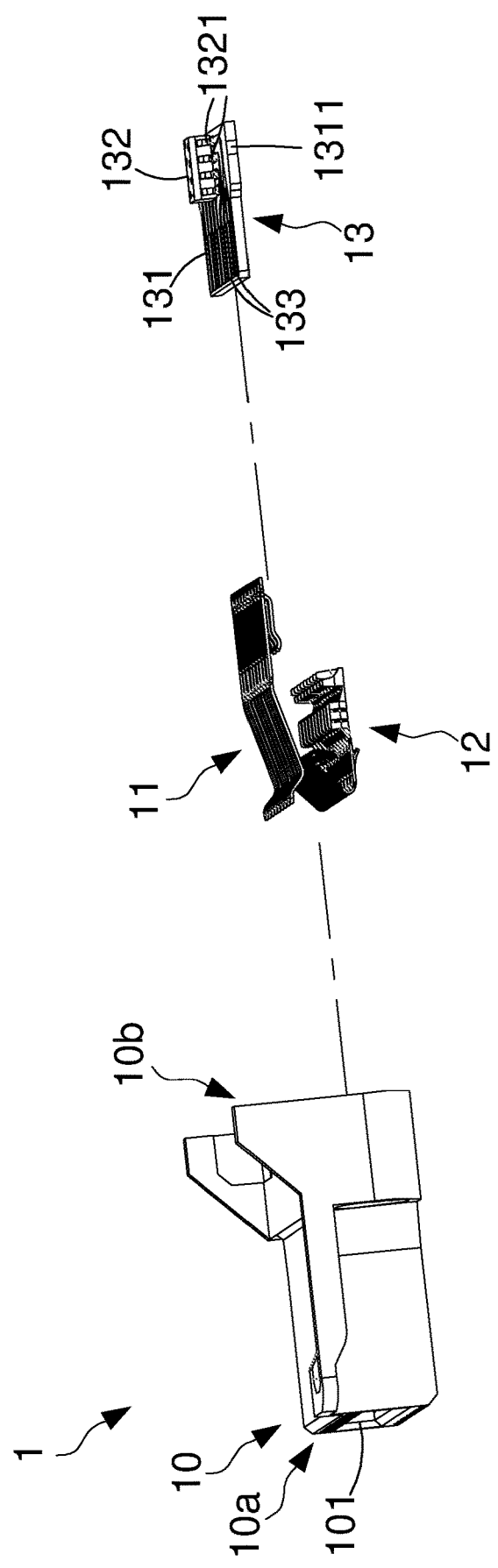
FIG. 2 is an exploded view of the connector of the first embodiment of the present disclosure.

The present disclosure will now be described more fully hereinafter with reference to the accompanying drawings, in which exemplary embodiments of the disclosure are shown. This present disclosure may, however, be embodied in many different forms and should not be construed as limited to the embodiments set forth herein. Rather, these embodiments are provided so that this present disclosure will be thorough and complete, and will fully convey the scope of the present disclosure to those skilled in the art.

Certain terms are used throughout the description and following claims to refer to particular components. As one skilled in the art will appreciate, manufacturers may refer to a component by different names. This document does not intend to distinguish between components that differ in name but function. In the following description and in the claims, the terms "include/including" and "comprise/comprising" are used in an open-ended fashion, and thus should be interpreted as "including but not limited to". "Substantial/ substantially" means, within an acceptable error range, the person skilled in the art may solve the technical problem in a certain error range to achieve the basic technical effect.

The following description is of the best-contemplated mode of carrying out the disclosure. This description is made for the purpose of illustration of the general principles of the disclosure and should not be taken in a limiting sense. The scope of the disclosure is best determined by reference to the appended claims.

Moreover, the terms "include", "contain", and any variation thereof are intended to cover a non-exclusive inclusion. Therefore, a process, method, object, or device that includes a series of elements not only includes these elements, but also includes other elements not specified expressly, or may include inherent elements of the process, method, object, or device. If no more limitations are made, an element limited by "include a/an . . . " does not exclude other same elements existing in the process, the method, the article, or the device which includes the element.

In the following embodiment, the same reference numerals are used to refer to the same or similar elements throughout the disclosure.

Figure 5:
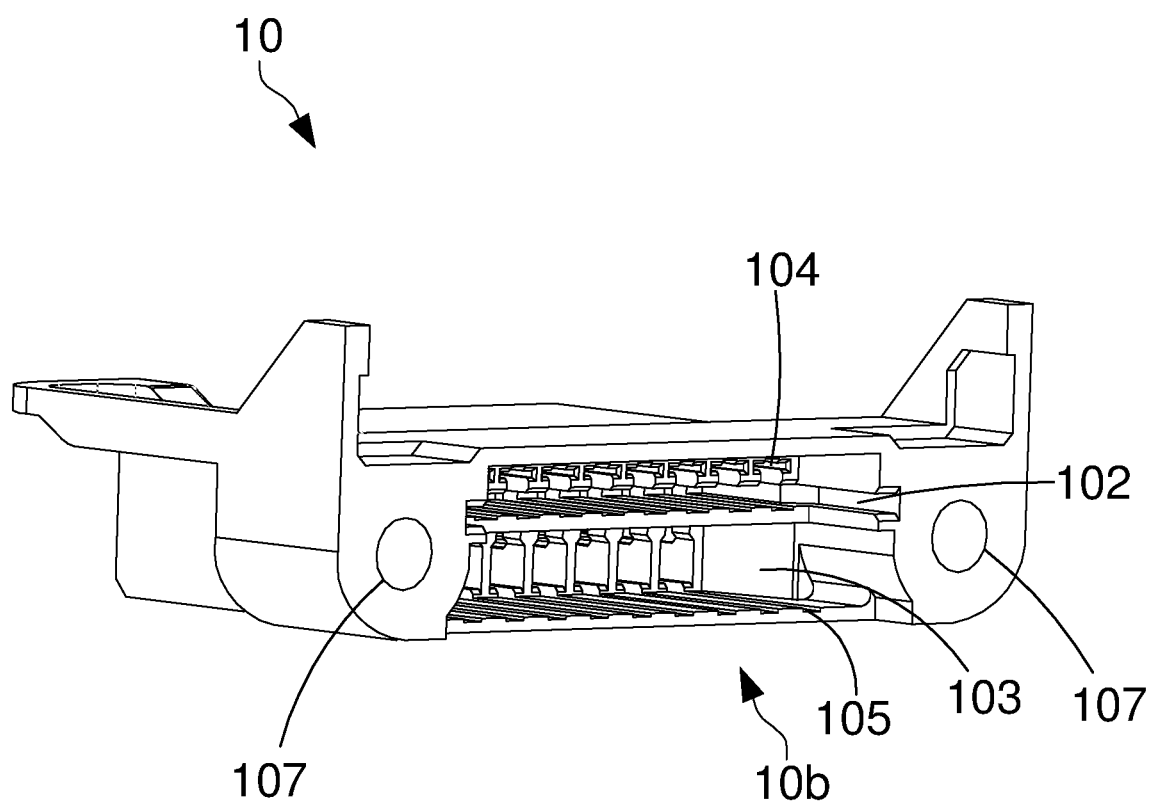
FIG. 5 is a perspective view of a connector body of the first embodiment of the present disclosure.

FIG. 1 to FIG. 4 are perspective view, exploded view, and cross-sectional views of a connector of the first embodiment of the present disclosure. FIG. 5 is a perspective view of a connector body of the first embodiment of the present disclosure. As shown in the figures, the connector 1 of the present embodiment comprises a connector body 10, a plurality of signal terminals 11, a plurality of wiring terminals 12, and a circuit board 13. The connector body 10 comprises an electrical connection slot 101, a circuit board slot 102, and a wiring slot 103. The connector body 10 comprises a first end 10a and a second end 10b. The electrical connection slot 101 is disposed at the first end 10a of the connector body 10. The circuit board slot 102 and the wiring slot 103 are disposed at the second end 10b of the connector body 10. The electrical connection slot 101 respectively communicates with the circuit board slot 102 and the wiring slot 103. The electrical connection slot 101 comprises a first sidewall 101a and a second sidewall 101b opposite to the first sidewall 101a. In this embodiment, the circuit board slot 102 is closer to the first sidewall 101a of the electrical connection slot 101 than the wiring slot 103, that is, the circuit board slot 102 is disposed above the wiring slot 103.

The plurality of signal terminals 11 and the plurality of wiring terminals 12 are disposed on a sidewall of the electrical connection slot 101. In this embodiment, the plurality of signal terminals 11 are disposed on the first sidewall 101a of the electrical connection slot 101, and the plurality of wiring terminals 12 are disposed on the second sidewall 101b of the electrical connection slot 101. The plurality of signal terminals 11 corresponds to the plurality of wiring terminals 12. One end of each of the plurality of signal terminals 11 away from the electrical connection slot 101 is disposed in the circuit board slot 102. The plurality of wiring terminals 12 corresponds to the plurality of signal terminals 11. The end of each of the plurality of wiring terminals 12 away from the electrical connection slot 101 extends toward the wiring slot 103.

The circuit board 13 comprises at least a circuit board body 131 and a plurality of conductive pads 133 disposed on the circuit board body 131. In this embodiment, the plurality of conductive pads 133 are disposed on one end of the circuit board body 131 at intervals and are aligned in a row. The circuit board body 131 could accommodate a plurality of elements which are connected to each other to form a circuit. Or, in this embodiment, the circuit board 13 further comprises a chip 132 disposed on the circuit board body 131. The chip 132 is soldered on the circuit board body 131. The chip 132 comprises a plurality of pins 1321 respectively connected to corresponding conductive pads 133. The circuit board 13 is inserted into circuit board slot 102. The plurality of conductive pads 133 are close to the electrical connection slot 101 and are in contact with the corresponding signal terminals 11, respectively. On one embodiment, an interference protrusion 1311 is provided on a side of the circuit board body 131. When the circuit board 13 is inserted into the circuit board slot 102, the interference protrusion 1311 of the circuit board body 131 is interferingly connected to a sidewall of the circuit board slot 102. In this embodiment, the number of the interference protrusions 1311 is two. The two interference protrusions 1311 are opposite to each other.

Figure 6:
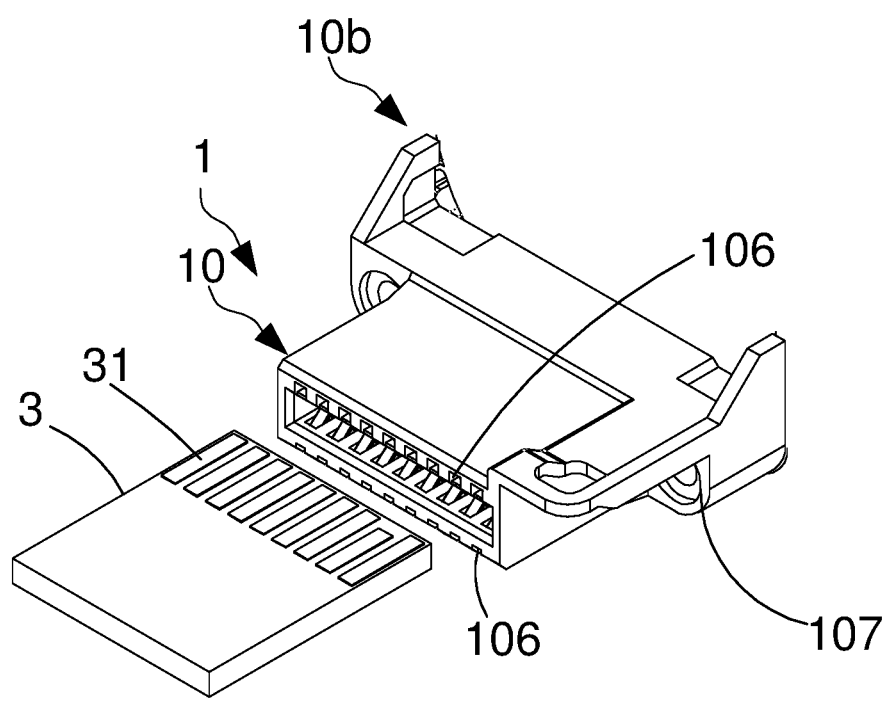
FIG. 6 is a use state diagram of the connector of the first embodiment of the present disclosure.

FIG. 6 is a use state diagram of the connector of the first embodiment of the present disclosure. As shown in the figure, the circuit of the external electronic device passes through the connection slot 103 and connects to the plurality of wiring terminals 12 when the connector 1 is in use. The plurality of wiring terminals 12 in this embodiment is power/signal terminals, respectively. The plurality of wiring terminals 12 is connected to electric wires in a circuit of an external electronic device. A plug connected to an electronic device could be inserted into the electrical connection slot 101. A plurality of conductive terminals 31 is provided on the plug 3 which could be a circuit board or an electrical connector. When the plug 3 is inserted into the electrical connection slot 101, the plurality of signal terminals 11 and the plurality of wiring terminals 12 are in contact with the plurality of conductive terminals 31 of the plug 3, respectively. Signal and power transmission between the circuit board 13 and electronic equipment could be realized through the electrical connection between the circuit board 13 and the electronic device allowed by the plurality of signal terminals 11, wherein the chip 132 receives and interprets signals transmitted from external electronic devices. Power and signal transmission between external electronic devices and electronic equipment could be realized through the electrical connection between external electronic devices and electronic equipment through the plurality of wiring terminals 12.

The circuit board 13 of the connector 1 of this embodiment is directly inserted into the circuit board slot 102 of the connector body 10. In this way, the circuit board 13 can be easily inserted into the connector body 10, and the conductive pads 133 of the circuit board 13 disposed in the connector body 10 can be stably connected to the corresponding signal terminals 11. Therefore, the reliability of the connector 1 can be effectively improved.

The details of the connector body 10, the signal terminal 11, and the wiring terminal 12 would be described in below. The connector body 10 further comprises a plurality of signal terminal slots 104 and a plurality of wiring terminal slots 105. The plurality of signal terminal slots 104 is disposed on the first sidewall 101a of the electrical connection slot 101 at intervals. Each of the plurality of signal terminal slots 104 extends toward and communicates with the circuit board slot 102. The plurality of wiring terminal slots 105 is disposed on the second sidewall 101b of the electrical connection slot 101 at intervals. Each of the plurality of wiring terminal slots 105 extends toward and communicates with the wiring slot 103. Each of the plurality of signal terminal sockets 104 passes through the first end 10a of the connector body 10, and each of the plurality of wiring terminal slots 105 passes through the second end 10b of the connector body 10, forming a plurality of openings 106 on the first end 10a of the connector body 10. The plurality of openings 106 could enhance the effect of heat dissipation.

The plurality of signal terminals 11 is respectively disposed in the corresponding signal terminal slots 104. The plurality of wiring terminals 12 is respectively disposed in the corresponding wiring terminal slots 105. Thus, the plurality of signal terminals 11 and the plurality of wiring terminals 12 are disposed in the connector body 10 at intervals.

Each of the plurality of signal terminals 11 comprises a first contacting part 111 and a second contacting part 112. When the signal terminal 11 passes through the signal terminal slot 104 from the second end 10b of the connector body 10, the signal terminal 11 moves along with the signal terminal slot 104 to the electrical connection slot 101. Then the first contacting part 111 would be disposed in the electrical connection slot 101, and the second contacting part 112 would be disposed in the signal terminal slot 104. When the circuit board 13 is inserted into the circuit board slot 102, the second contacting part 112 of the signal terminals 11 would respectively contact with the plurality of conductive pads 133 of the circuit board 13. When the plug 3 is inserted into the electrical connection slot 101, the plurality of first contact parts 111 of the plurality of signal terminals 11 would be in contact with the plurality of conductive terminals 31 of the plug 3, respectively.

Figure 7:
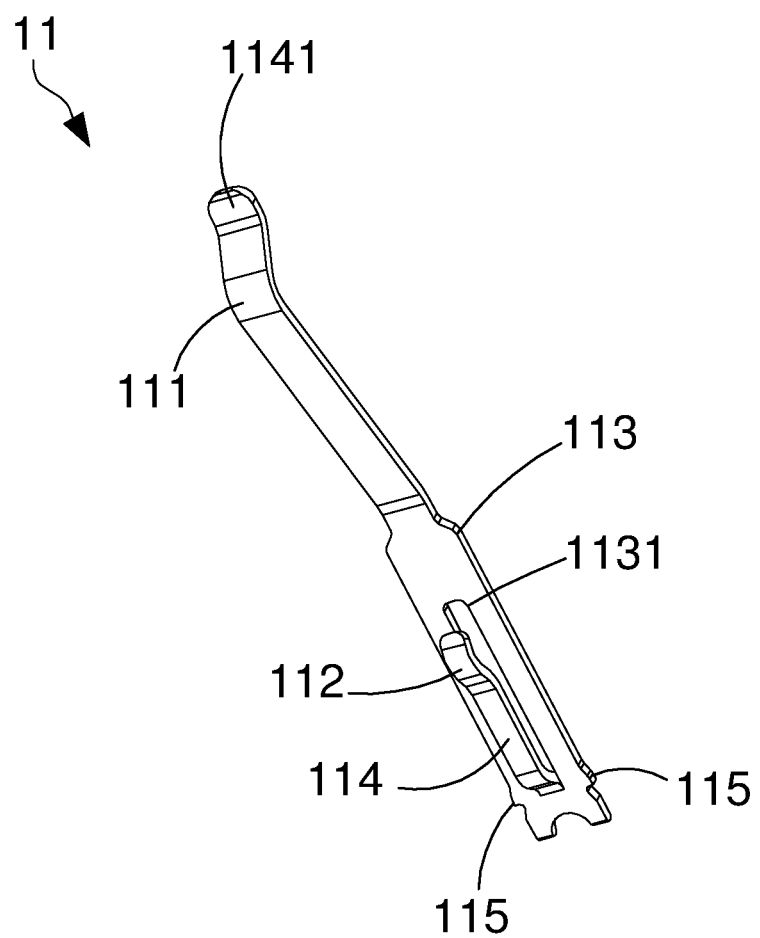
FIG. 7 is a perspective view of a signal terminal of the first embodiment of the present disclosure.

FIG. 7 is a perspective view of a signal terminal of the first embodiment of the present disclosure. As shown in the figure, each of the plurality of signal terminals 11 comprises a first metal spring plate 113 and a second metal spring plate 114. One end of the second metal spring plate 114 is connected to the first metal spring plate 113. The other end of the second metal spring plate 114 is away from the first metal spring plate 113, that is, there is a gap between the second metal spring plate 114 and the first metal spring plate 113. One end of the first metal spring plate 113 away from the second metal spring plate 114 is bent. The first metal spring plate 113 is bent toward the second metal spring plate 114 after being bent twice, forming a protrusion at the end of the bend, which is the first contacting part 111. The bend at the end is the guiding part 1141 corresponds to the opening 106. When the plurality of signal terminals 11 is moving along the plurality of signal terminal slots 104, the guiding part 1141 positions the plurality of signal terminals 11 in the connector body 10. One end of the second metal spring plate 114 that is not connected to the first metal spring plate 113 is bent to form a protrusion, which is the second contacting part 112. When the circuit board 13 is inserted into the circuit board slot 102, the circuit board 13 compresses the second metal spring plate 114 to move toward the first metal spring plate 113, having the circuit board 13 to be movable in the circuit board slot 102. When the circuit board 13 is fully inserted into the circuit board slot 102, the second metal spring plate 114 is compressed to generate an elastic force pressing the second contacting part 112 to firmly contact the corresponding conductive pads 133.

In one embodiment, the first metal spring plate 113 of this embodiment further comprises a first retaining hole 1131 corresponding to the second metal spring plate 114. The first retaining hole 1131 allows the second metal spring plate 114 to enter the first retaining hole 1131 when the second metal spring plate 114 moves toward the first metal spring plate 113. In this way, it is ensured that the circuit board 13 could enter the circuit board slot 102 without obstruction. In one embodiment, the two sides of the plurality of signal terminals 11 in this embodiment further comprise a terminal interference part 115, respectively. When the circuit board 13 is completely inserted into the circuit board slot 102, the two terminal interference parts 115 interfere with two opposite sidewalls of the signal terminal slot 104 to secure the plurality of signal terminals 11 in the corresponding signal terminal slot 104, preventing the plurality of signal terminals 11 from exiting from the corresponding signal terminal slot 104.

Figure 3:
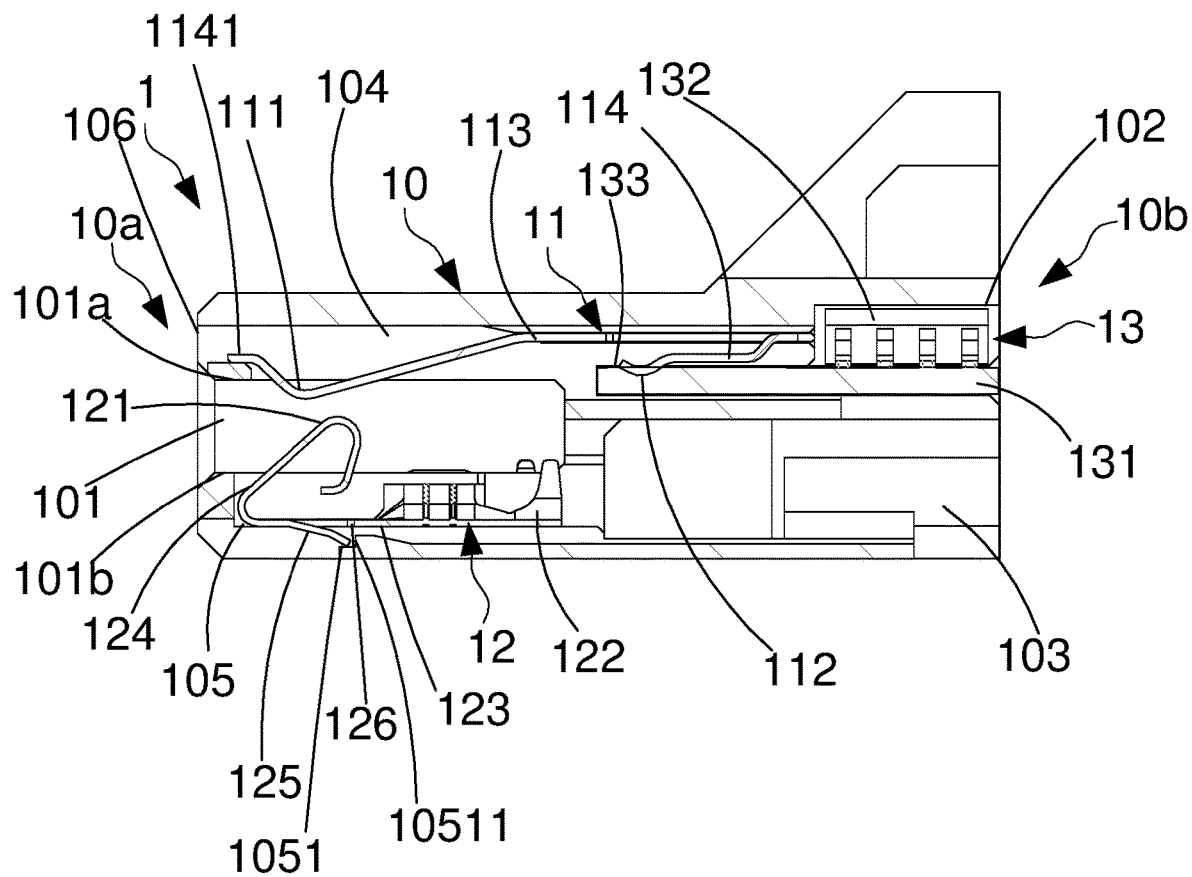
FIG. 3 is a cross-sectional view of the connector of the first embodiment of the present disclosure.
Figure 4:
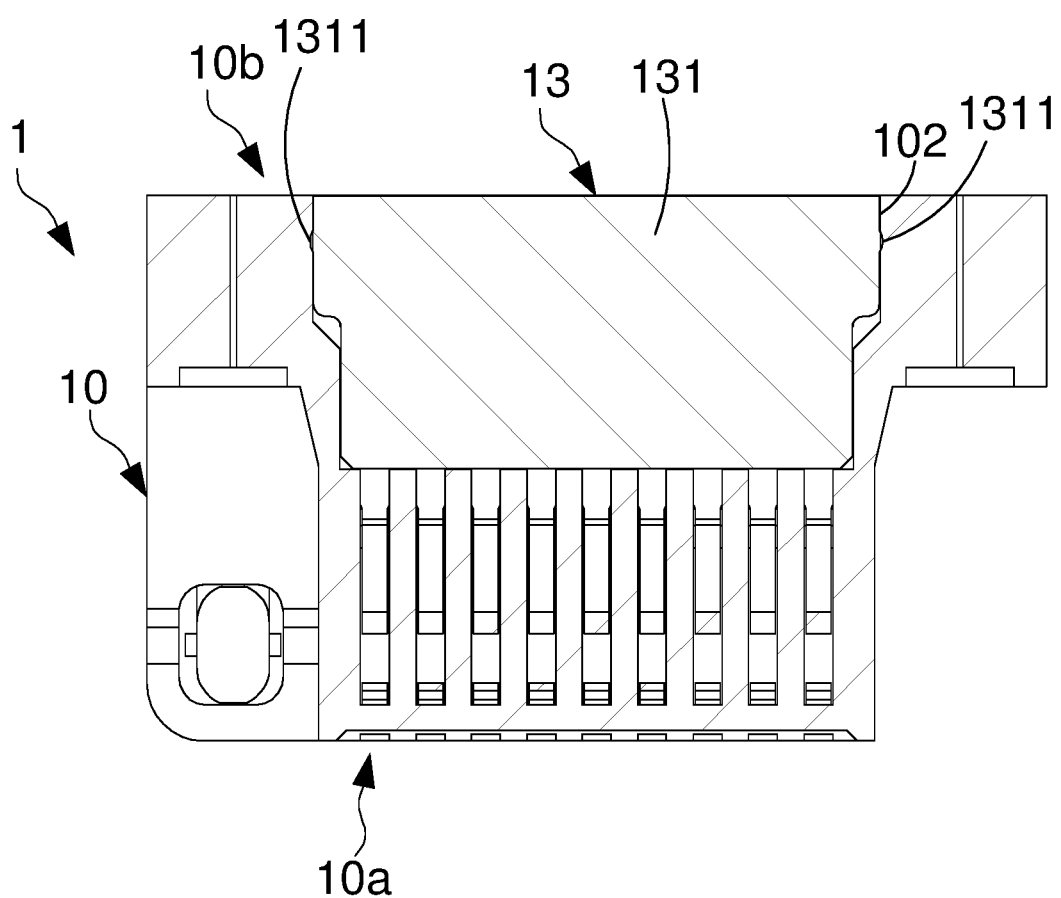
FIG. 4 is another cross-sectional view of the connector of the first embodiment of the present disclosure.

Back to FIG. 3, each of the plurality of wiring terminals 12 comprises a contacting part 121 and a connecting part 122 connected to a wire of external electronic devices. When each of the plurality of wiring terminals 12 is inserted into the corresponding wiring terminal slot 105, the contacting part 121 of each of the plurality of wiring terminals 12 is disposed in the electrical connection slot 101, the wire connected to the connecting part 122 is disposed in the corresponding wiring terminal 105, and the wire of the external electronic devices is integrated in the wiring slot 103. When the plug 3 is inserted into the electrical connection slot 101, the plurality of contacting parts 121 of the plurality of wiring terminals 12 is in contact with the plurality of conductive terminals 31 of the plug 3, respectively.

Figure 8:
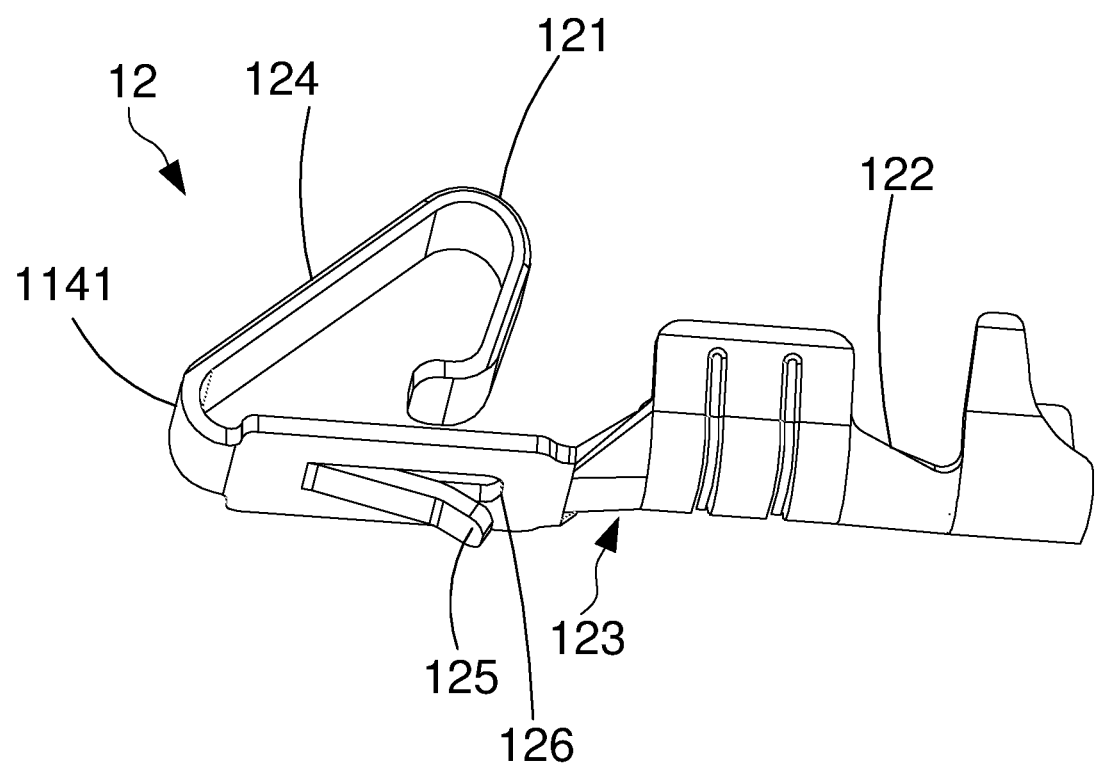
FIG. 8 is a perspective view of a wiring terminal of the first embodiment of the present disclosure.

FIG. 8 is a perspective view of a wiring terminal of the first embodiment of the present disclosure. As shown in the figure, the wiring terminal 12 of this embodiment comprises a terminal body 123 and a bent spring plate 124. One end of the bent spring plate 124 is connected to the terminal body 123. The other end of the bent spring plate 124 is disposed above the terminal body 123. The protrusion of the bent spring plate 124 is the contacting part 121. A gap exists between the bent spring plate 124 and the terminal body 123, making the bent spring plate 124 movable relative to the terminal body 123. When the plug 3 is inserted into the electrical connection slot 101, the plug 3 would compress the bent spring plate 124 to move toward the terminal body 123, having the plug 3 to be movable in the electrical connection slot 101. When the plug 3 is fully inserted into the electrical connection slot 101, the elastic force generated by the compressed bent spring plate 124 enables the contacting part 121 to firmly contact the conductive terminal 31 of the plug 3.

In one embodiment, the wiring terminal 12 of this embodiment further comprises a spring buckle 125 extending toward the second end 10b of the connector body 10. The wiring terminal slot 105 further comprises a buckling part 1051, of which the surface facing the first end 10a of the connector body 10 is an abutment surface 10511 perpendicular to a lower sidewall of the electrical connection slot 101. When the wiring terminal 12 is inserted into the corresponding wiring terminal slot 105, the abutment surface 10511 of the buckling part 1051 could block one end of the spring buckle 125 facing toward the second end 10b of the connector body 10 to prevent the wiring terminal 12 from being detached from the connector body 10. In one embodiment, one end of the spring buckle 125 facing the second end 10b of the connector body 10 is a movable end, that is, the spring buckle 125 is compressible. In this way, the wiring terminal 12 is inserted between the wiring terminal slot 105 and the buckling part 1051, and the spring buckle 125 is compressed meanwhile. When the spring buckle 125 of the wiring terminal 12 moves to the buckling part 1051, the spring buckle 125 is ejected toward the lower sidewall of the electrical connection slot 101 and abuts against the abutment surface 10511 of the buckling part 1051. The wiring terminal 12 of this embodiment further comprises a second retaining hole 126 corresponding to the spring buckle 125 to accommodate the compressed spring buckle 125. In this way, the wiring terminal 12 is movable in the corresponding wiring terminal slot 105.

Figure 9:
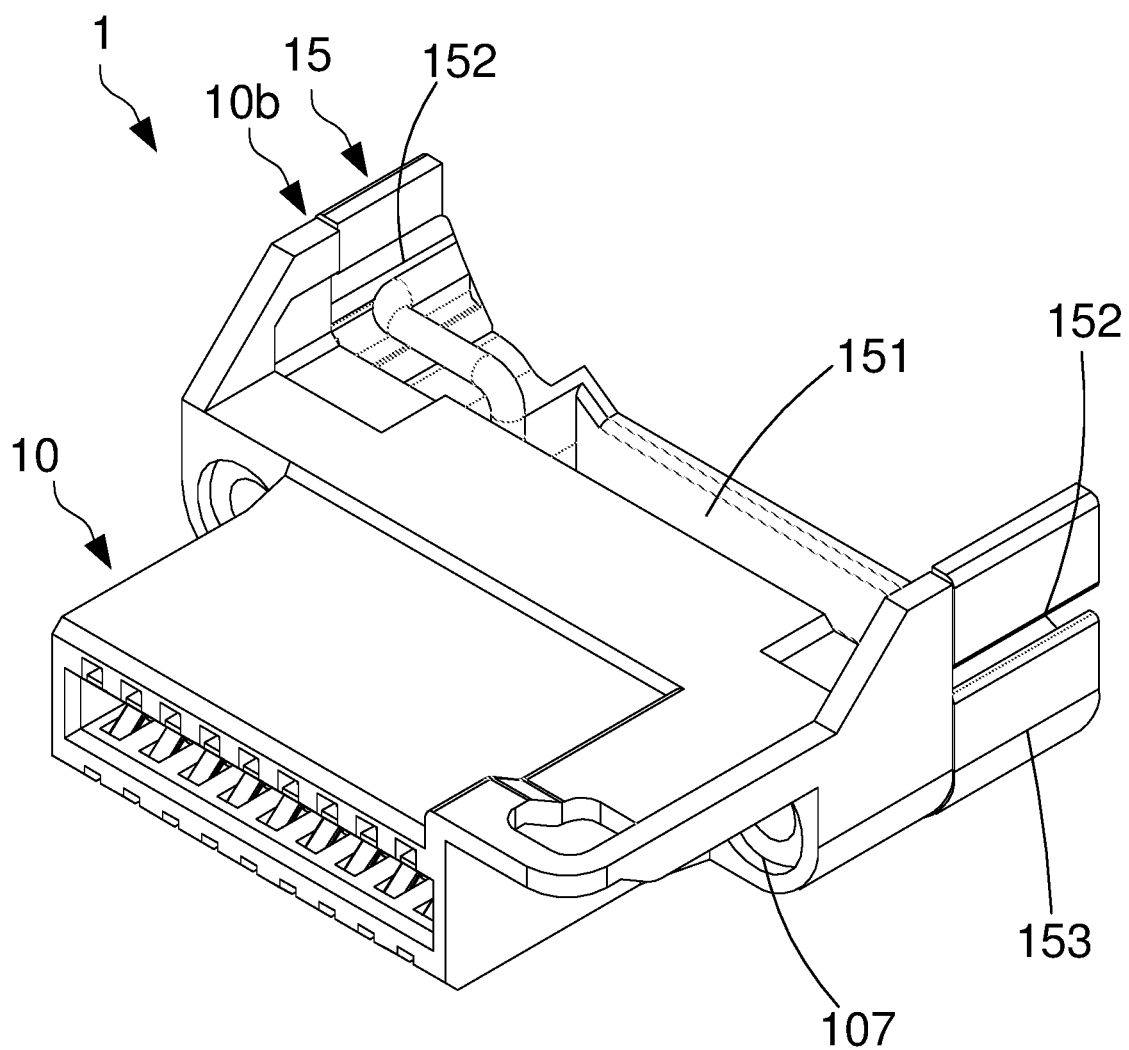
FIG. 9 is a perspective view of a connector of the second embodiment of the present disclosure.
Figure 10:
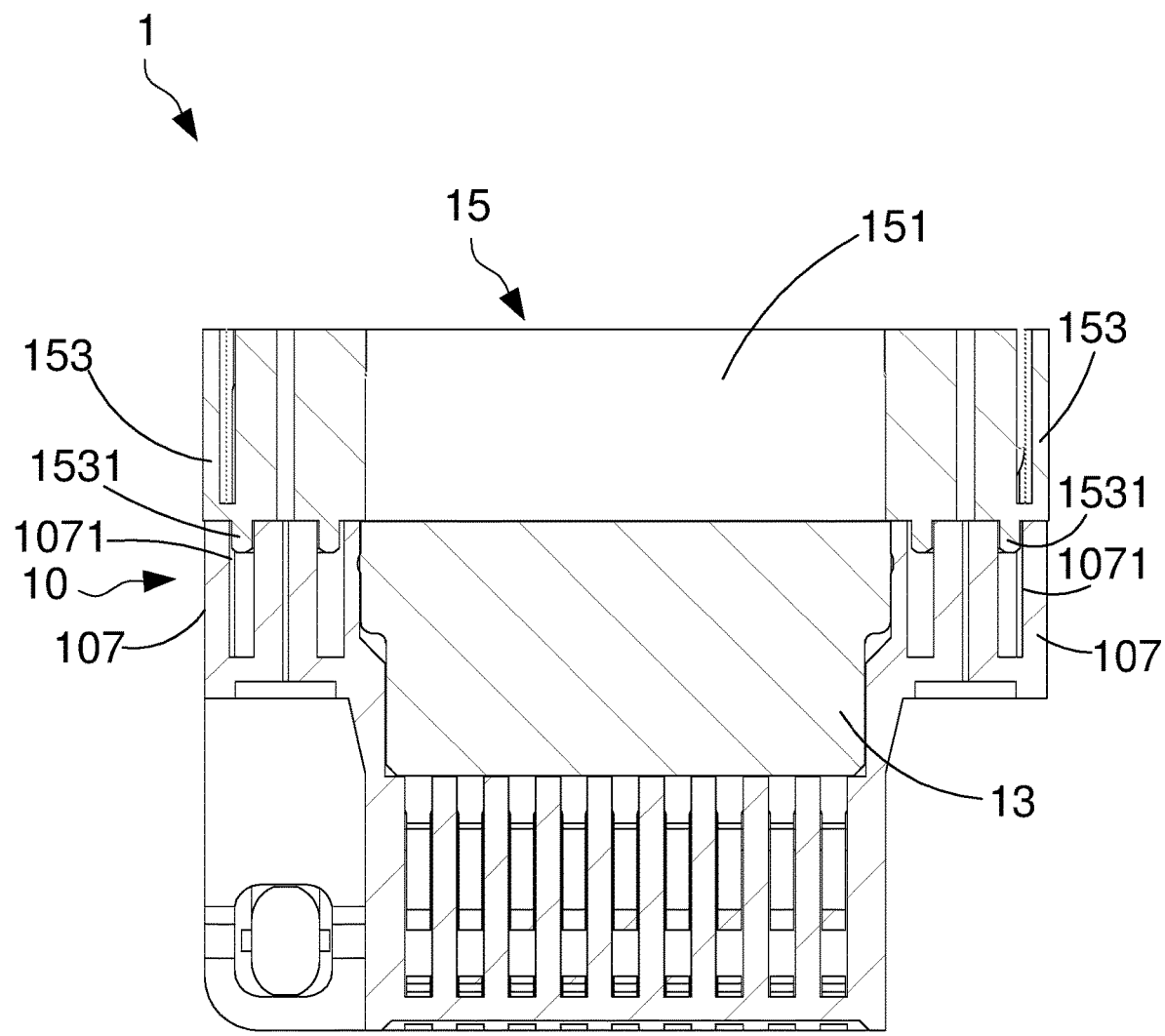
FIG. 10 is a cross-sectional view of the connector of the second embodiment of the present disclosure.

FIG. 9 and FIG. 10 are perspective view and cross-sectional view of a connector of the second embodiment of the present disclosure. As shown in the figure, the connector 1 of this embodiment is different from that of the first embodiment in that the connector 1 of this embodiment further comprises an anti-disengaging part 15, which is disposed on the second end 10b of the connector body 10 and corresponds to the circuit board 13. The anti-disengaging part 15 could prevent the circuit board 13 from disengaging from the circuit board slot 102 of the connector body 10. The surface of the anti-disengaging part 15 facing the circuit board 13 abuts against the circuit board 13 to block the circuit board 13 from disengaging from the circuit board slot 102 of the connector body 10.

In one embodiment, the anti-disengaging part 15 further comprises a wire accommodating slot 151 communicates with the wiring slot 103. The wire connected to the wring terminal 12 passes through the wire accommodating slot 151. The surfaces of the anti-disengaging part 15 disposed on two sides of the wire accommodating slot 151 abut against the circuit board 13. In one embodiment, wiring holes 152 are further provided on two sides of the anti-disengaging part 15, allowing the wire in the wire accommodating slot 151 to pass through the two wiring holes 152, simply clarifying the wiring direction and facilitating wire management.

The connector body 10 of this embodiment comprises a locking part 107. The anti-disengaging part 15 comprises a positioning part 153 connected to the locking part 107 of the connector body 10. A locking member passes through the locking part 107 of the connector body 10 and the positioning part 153 of the anti-disengaging part 15 to secure the connector body 10 and the anti-disengaging part 15.

In one embodiment, the locking part 107 comprises a positioning recess 1071. The positioning part 153 comprises a positioning protrusion 1531. When the locking part 107 is connected to the positioning part 153, the positioning protrusion 1531 is disposed on the positioning recess 1071, so as to dispose the anti-disengaging part 15 on the connector body 10 in advance. In this way, the locking part 107 could correspond to the positioning part 153, so that the locking member can easily pass through the locking part 107 and the positioning part 153. Meanwhile, the connection stability between the anti-disengaging part 15 and the connector body 10 would be increased. The positioning recess 1071 of the locking part 107 can be replaced with a positioning protrusion, and the positioning protrusion 1531 of the positioning part 153 can be replaced with a positioning recess for the identical effect as described above.

Figure 11:
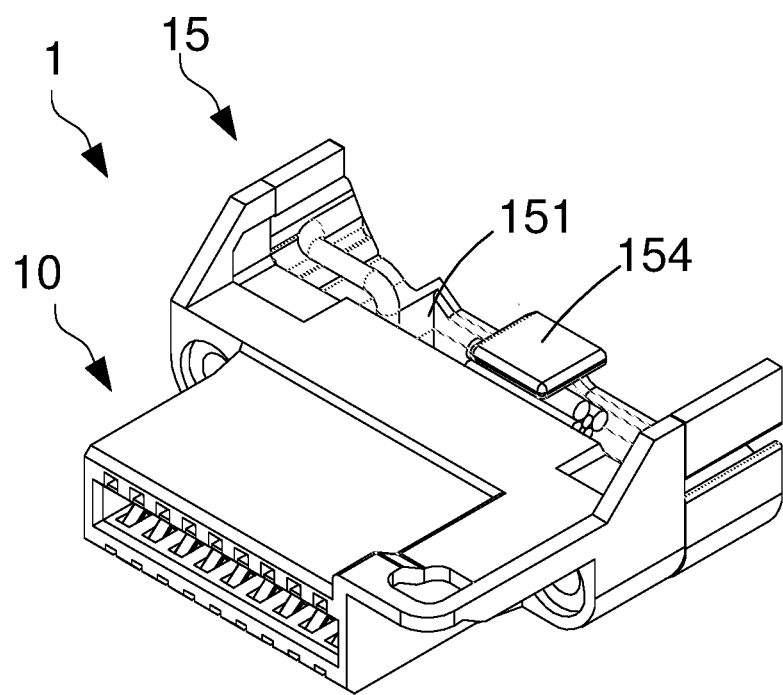
FIG. 11 is a perspective view of a connector of the third embodiment of the present disclosure.

FIG. 11 is a perspective view of a connector of the third embodiment of the present disclosure. As shown in the figure, the connector 1 of this embodiment is different from that of the second embodiment in that the anti-disengaging part 15 of this embodiment further comprises a wiring securing block 154 disposed above the wire accommodating slot 151. The wiring between the wiring terminals and the external electronic devices passes through the wire accommodating slot 151. The wiring securing block 154 secures the wiring in the wire accommodating slot 151 to prevent the wiring from detaching from the wire accommodating slot 151.

In this embodiment, the side length of the wiring securing block 154 parallel to the connector body 10 is smaller than the side length of the wire accommodating slot 151 parallel to the connector body 10. In this way, wiring spaces are available on two sides of the wiring securing block 154 allowing the wiring passing through the wiring spaces.

Figure 12:
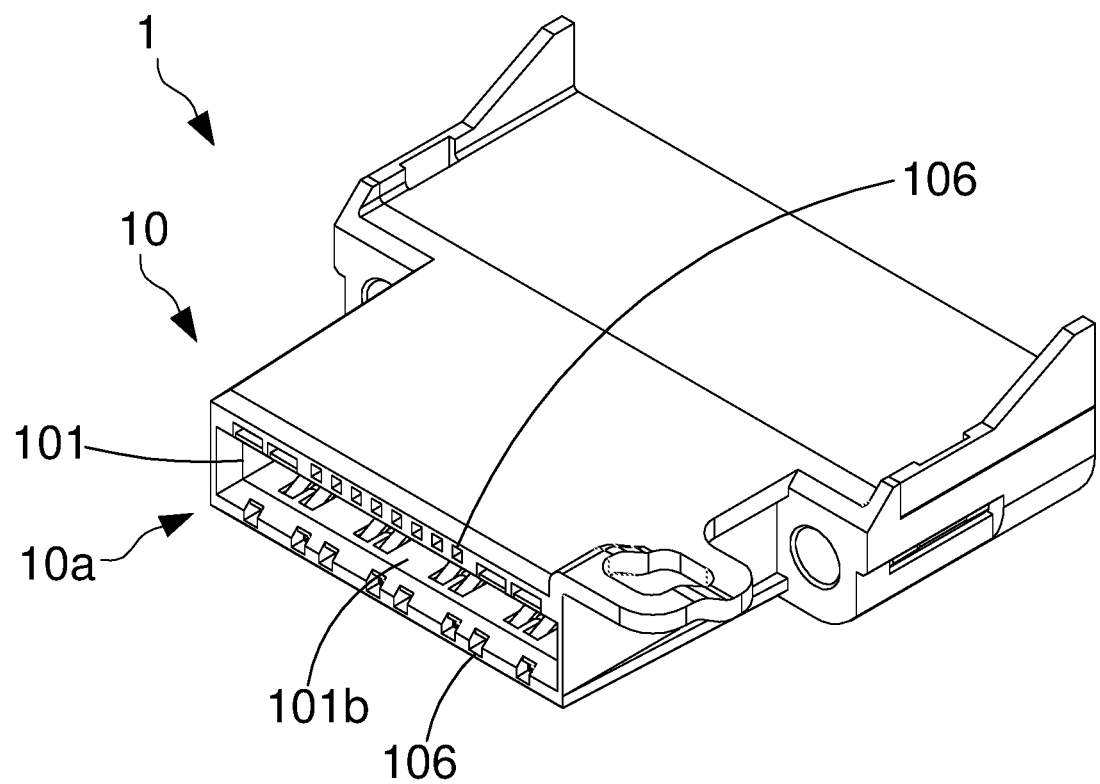
FIG. 12 is a perspective view of a connector of the fourth embodiment of the present disclosure.
Figure 13:
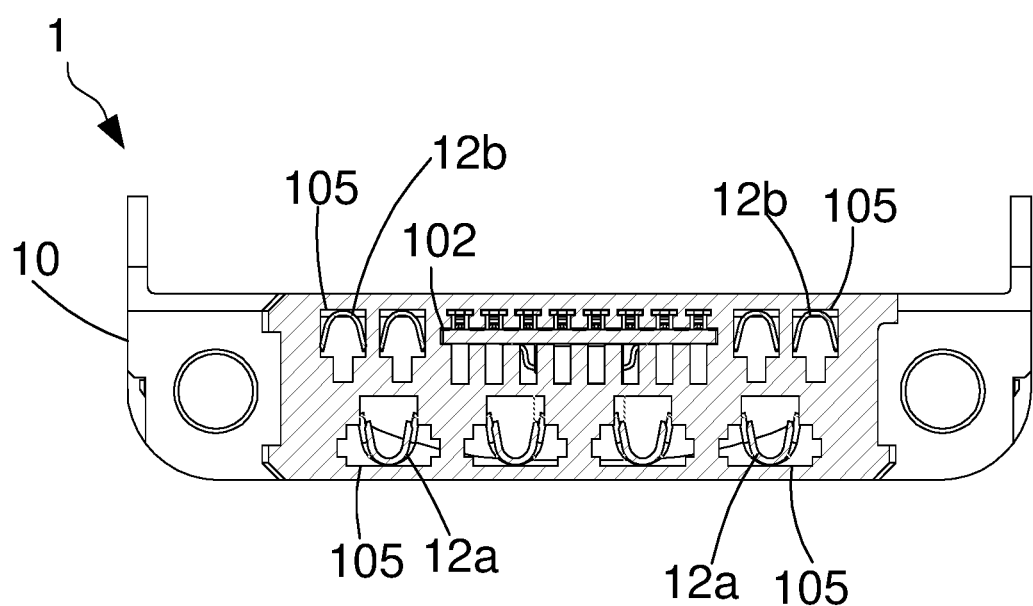
FIG. 13 is a cross-sectional view of the connector of the fourth embodiment of the present disclosure.
Figure 14:
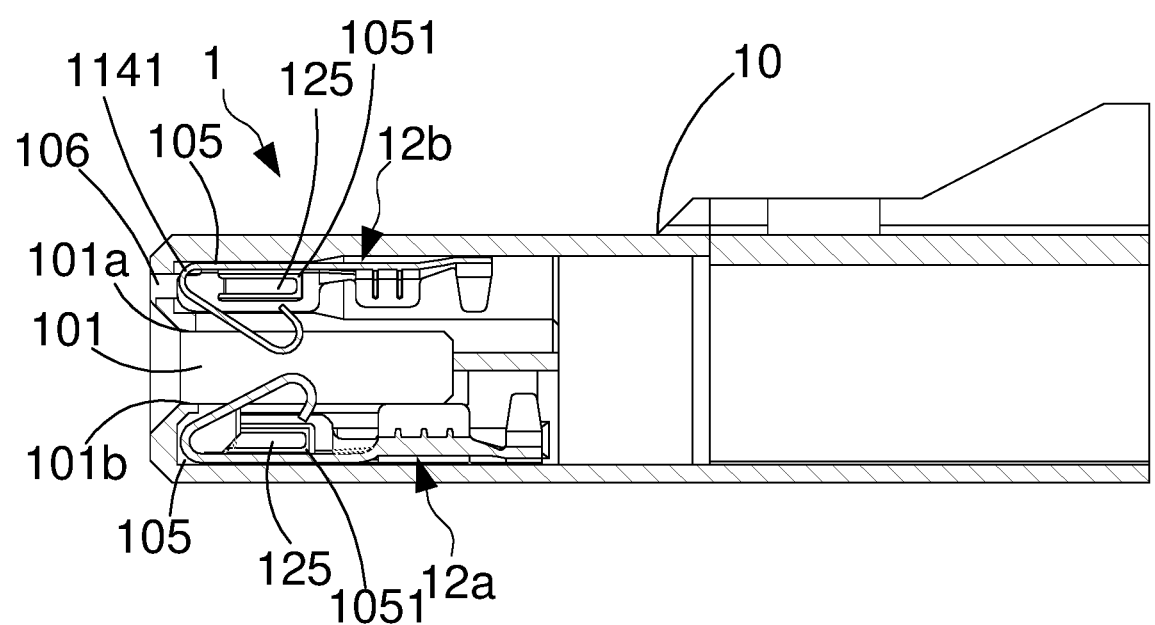
FIG. 14 is another cross-sectional view of the connector of the fourth embodiment of the present disclosure.

FIG. 12 to FIG. 14 are perspective view and cross-sectional views of a connector of the fourth embodiment of the present disclosure. As shown in the figure, the difference between the connector 1 of this embodiment and that of the above embodiments is that a plurality of wiring terminal slots 105 of this embodiment surrounds a circuit board slot 102. That is, the plurality of wiring terminal slots 105 is disposed on two sides and below the circuit board slot 102. A plurality of wiring terminals is respectively disposed on a first sidewall 101a and a second sidewall 101b of an electrical connection slot 101. Thus, the first sidewall 101a and the second sidewall 101b of the electrical connection slot 101 are respectively provided with a plurality of wiring terminal slots 105. The plurality of wiring terminal slots 105 on first side wall 101s is disposed on two sides of the circuit board slot 102. The plurality of wiring terminals is disposed in the plurality of wiring terminal slots 105. The wiring of the external electronic devices enters the connector 1 through the wiring slot 103 and is connected to one end of each of the plurality of wiring terminals away from the electrical connection slot 101. The plurality of wiring terminals comprises a plurality of first wiring terminals 12a and a plurality of second wiring terminals 12b. In this embodiment, the plurality of first wiring terminals 12a is disposed in the plurality of wiring terminal slots 105 on the second sidewall 101b, and the plurality of second wiring terminals 12b is disposed in the plurality of wiring terminal slots 105 on the first sidewall 101a. The first wiring terminal 12a is a power terminal, which is connected to the wire of external electronic devices to be electrically connected to external electronic equipment supplying power to external electronic devices. The second wiring terminal 12b is a signal terminal, which is connected to the signal wire of external electronic devices to be electrically connected to external electronic equipment, enabling signal transmission between external electronic devices and external electronic equipment. The first wiring terminal 12a could be a signal terminal, and the second wiring terminal 12b could be a power terminal. The plurality of first wiring terminals 12a and the plurality of second wiring terminals 12b could be arbitrarily disposed in the corresponding wiring terminal slots 105, respectively.

Figure 15:
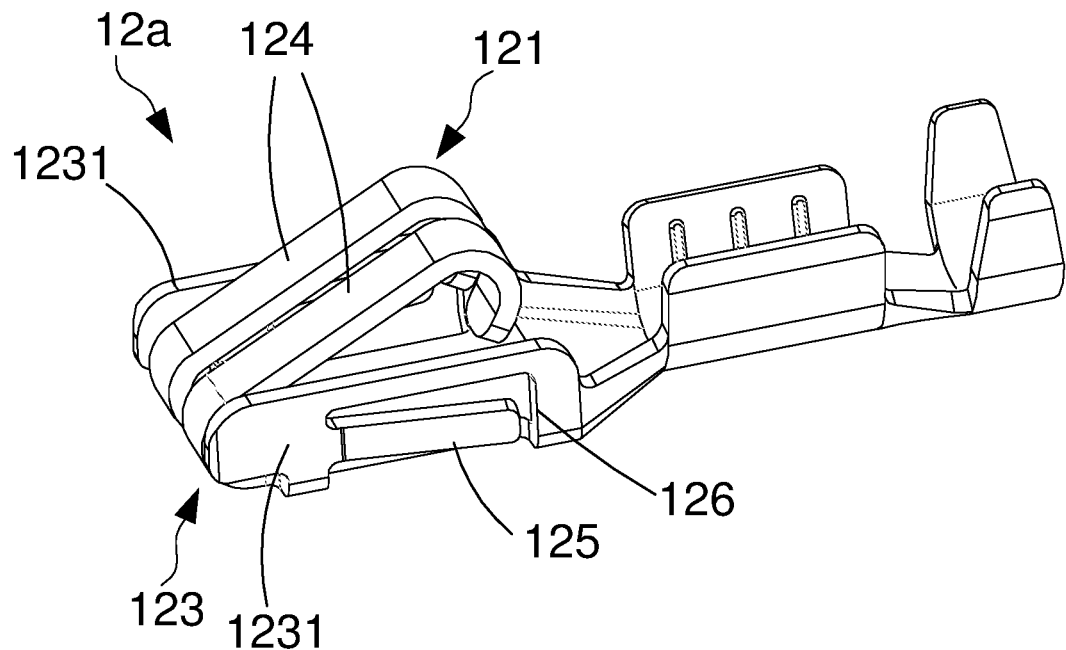
FIG. 15 is a perspective view of a first wiring terminal of the fourth embodiment of the present disclosure.
Figure 16:
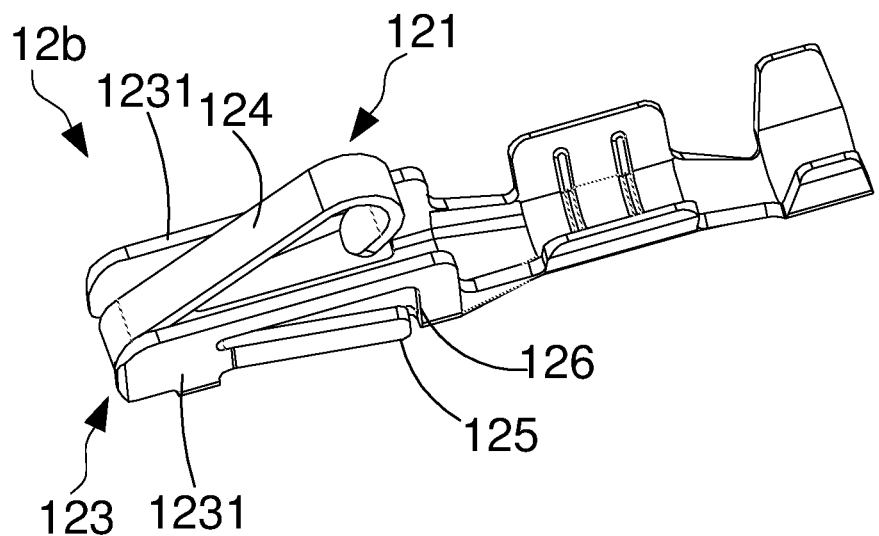
FIG. 16 is a perspective view of a second wiring terminal of the fourth embodiment of the present disclosure.

FIG. 15 is a perspective view of a first wiring terminal of the fourth embodiment of the present disclosure. FIG. 16 is a perspective view of a second wiring terminal of the fourth embodiment of the present disclosure. As shown in the figures, the first wiring terminal 12a and the second wiring terminal 12b are substantially the same as the wiring terminal of the first embodiment. The difference is that each of the plurality the first wiring terminal 12a is provided with two bent spring plates 124 disposed at intervals. The protrusion of each of the two bent spring plates 124 is a contacting part 121 of the first wiring terminal 12a, indicating that the contacting part 121 of each of the plurality of first wiring terminals 12a comprises a double protrusion. Each of the plurality of second wiring terminals 12b presents identical features to the wiring terminals of the first embodiment with a single bent spring piece 124. That is, the contacting part 121 of each of the plurality of second terminals 12b is provided with a single protrusion.

The terminal body 123 of each of the plurality of first wiring terminals 12a of this embodiment is provided with two positioning protrusions 1231 opposite to each other. When each of the plurality of first wiring terminal 12a is inserted into the corresponding wiring terminal slot 105, the two opposite positioning protrusions 1231 move along the sidewalls of the adjacent wiring terminal slot 105 into the wiring terminal slot 105 respectively. Therefore, the two positioning protrusions 1231 have the effect of guiding each of the plurality of first wiring terminals 12a into the wiring terminal slot 105. The number of the spring buckles 125 of each of the plurality of first wiring terminals 12a is two. Each spring buckle 125 is disposed on the corresponding positioning protrusion 1231. That is, the two spring buckles 125 are disposed on two sides of the bent spring plate 124. The number of the buckling parts 1051 of the wiring terminal slot 105 is also two. The two buckling parts 1051 respectively correspond to the two spring buckles 125. Meanwhile, each of the plurality of first wiring terminals 12a comprises two second retaining holes 126 respectively corresponding to the two spring buckles 125. Each of the plurality of second wiring terminals 12b also comprises two positioning protrusions 1231. The configuration of the spring buckles 125 and the second retaining holes 126 on each of the plurality of second wiring terminals 12b is identical to that on each of the plurality of first wiring terminals 12a.

In summary, the present disclosure proposed a connector possibly to have a variety of functions for better convenience of use through inserting circuit boards according to various user requirements. Meanwhile, the reliability of the connector can be improved by the stable connection between the conductive pads of the circuit board disposed in the connector body and the corresponding signal terminals. Besides, the anti-disengaging part prevents the circuit board from disengaging from the circuit board slot for further improvement to the reliability of the connector.

It is to be understood that the term "comprises", "comprising", or any other variants thereof, is intended to encompass a non-exclusive inclusion, such that a process, method, article, or device of a series of elements not only include those elements but also includes other elements that are not explicitly listed, or elements that are inherent to such a process, method, article, or device. An element defined by the phrase "comprising a . . . " does not exclude the presence of the same element in the process, method, article, or device that comprises the element.

Although the present disclosure has been explained in relation to its preferred embodiment, it does not intend to limit the present disclosure. It will be apparent to those skilled in the art having regard to this present disclosure that other modifications of the exemplary embodiments beyond those embodiments specifically described here may be made without departing from the spirit of the disclosure. Accordingly, such modifications are considered within the scope of the disclosure as limited solely by the appended claims.

What is claimed is:

1. A connector, comprising:
   a connector body comprising an electrical connection slot, a circuit board slot, and a wiring slot; the electrical connection slot is disposed at one end of the connector body; the circuit board slot and the wiring slot are disposed at the other end of the connector body; the electrical connection slot respectively communicates with the circuit board slot and the wiring slot;
   a plurality of signal terminals disposed on the sidewall of the electrical connection slot; one end of each of the plurality of signal terminals away from the electrical connection slot is disposed in the circuit board slot;
   a plurality of wiring terminals disposed on the sidewall of the electrical connection slot; the plurality of wiring terminals corresponds to the plurality of signal terminals, respectively; one end of each of the plurality of wiring terminals away from the electrical connection slot extends toward the wiring slot; and
   a circuit board comprising a circuit board body and a plurality of conductive pads disposed on the circuit board body; the circuit board is inserted into the circuit board slot; the plurality of conductive pads is respectively in contact with the corresponding signal terminals.

2. The connector according to claim 1, wherein an interference protrusion is provided on a side of the circuit board body; the interference protrusion is interferingly connected to a sidewall of the circuit board slot.

3. The connector according to claim 1, wherein the electrical connection slot comprises a first sidewall and a second sidewall opposite to the first sidewall; the connector body further comprises a plurality of signal terminal slots disposed on the first sidewall of the electrical connection slot at intervals; the plurality of signal terminal slots extends toward the circuit board slot; the plurality of signal terminal slots communicates with the circuit board slot; the plurality of signal terminals is respectively disposed in corresponding signal terminal slots.

4. The connector according to claim 3, wherein the wiring slot is disposed below the circuit board slot; the connector body further comprises a plurality of wiring terminal slots disposed on the second sidewall of the electrical connection slot at intervals; each of the wiring terminal slots extends toward the connection slot; each of the wiring terminal slots communicates with the connection slot; the plurality of wiring terminals is respectively disposed in corresponding wiring terminal slots.

5. The connector according to claim 3, wherein the wiring slot is disposed at the circumsphere of the circuit board slot; the connector body further comprises a plurality of wiring terminal slots disposed on the first sidewall and the second sidewall of the electrical connection slot at intervals; the wiring terminal slots on the first sidewall are disposed on two sides of the circuit board slot; each of the wiring terminal slots extends toward the connection slot; each of the wiring terminal slots communicates with the connection slot; the plurality of wiring terminals is respectively disposed in corresponding wiring terminal slots.

6. The connector according to claim 4, wherein the plurality of wiring terminals comprises a plurality of power wiring terminals and a plurality of signal wiring terminals disposed in the plurality of wiring terminal slots.

7. The connector according to claim 5, wherein the plurality of wiring terminals comprises a plurality of power wiring terminals and a plurality of signal wiring terminals disposed in the plurality of wiring terminal slots.

8. The connector according to claim 4, wherein each of the plurality of wiring terminal slots comprises at least one buckling part; each of the plurality of wiring terminal slots comprises at least one spring buckle; each of the spring buckles abuts against the corresponding buckling part.

9. The connector according to claim 5, wherein each of the plurality of wiring terminal slots comprises at least one buckling part; each of the plurality of wiring terminal slots comprises at least one spring buckle; each of the spring buckles abuts against the corresponding buckling part.

10. The connector according to claim 7, wherein each of the plurality of wiring terminals comprises a connecting part and a contacting part disposed in the electrical connection slot; the contacting part is in contact with the corresponding conductive terminals; the connecting part is connected to a circuit disposed in the wiring slot.

11. The connector according to claim 8, wherein each of the plurality of the wiring terminals comprising a terminal body and least one bent spring plate; one end of each of the bent spring plates is connected to the terminal body; another end of each of the bent spring plates is disposed above the terminal body; a gap exists between another end of each of the bent spring plates and the terminal body; the protrusion of each of the bent spring plates is the contacting part.

12. The connector according to claim 9, wherein the terminal body comprises two positioning protrusions opposite to each other; the two positioning protrusions guide the plurality of the wiring terminals into the corresponding wiring terminal slots.

13. The connector according to claim 12, wherein the number of the spring buckle is two; the two spring buckles are respectively disposed on the two positioning protrusions.

14. The connector according to claim 1, wherein each of the plurality of the signal terminals comprises a first contacting part and a second contacting part; the first contacting part is disposed in the electrical connection slot; the first contacting part is in contact with the corresponding conductive terminals; the second contacting part is disposed in the circuit board slot; the second contacting part is in contact with the corresponding conductive pads.

15. The connector according to claim 1 further comprising an anti-disengaging part disposed at the other end of the connector body; the anti-disengaging part corresponds to the circuit board to block the circuit board.

16. The connector according to claim 15, wherein the connector body comprises a locking part; the anti-disengaging part comprises a positioning part; the anti-disengaging part is connected to the locking part of the connector body through the positioning part.

\* \* \* \* \*